(12) United States Patent
Liu et al.

(10) Patent No.: US 6,720,818 B1
(45) Date of Patent: Apr. 13, 2004

(54) METHOD AND APPARATUS FOR MAXIMIZING AN AMPLITUDE OF AN OUTPUT SIGNAL OF A DIFFERENTIAL MULTIPLEXER

(75) Inventors: Zhixiang Jason Liu, San Diego, CA (US); Shuyu Lei, Milpitas, CA (US); Harry Huy Dang, San Diego, CA (US); Thomas Clark Bryan, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/290,659

(22) Filed: Nov. 8, 2002

(51) Int. Cl.[7] .................... H03K 17/62; H03K 17/76; H03K 17/693; H03K 7/735

(52) U.S. Cl. ...................................... 327/408

(58) Field of Search ................ 327/407, 408, 327/411

(56) References Cited

U.S. PATENT DOCUMENTS

| | | | |
|---|---|---|---|
| 5,289,048 A | * | 2/1994 | Ishihara et al. ............. 327/407 |
| 5,801,571 A | * | 9/1998 | Allen et al. ................ 327/407 |
| 6,385,214 B1 | * | 5/2002 | Kikuchi et al. ............ 370/537 |

* cited by examiner

Primary Examiner—Terry D. Cunningham
Assistant Examiner—Quan Tru
(74) Attorney, Agent, or Firm—INCAPLAW; Terrance A. Meador

(57) ABSTRACT

An amplitude of a differential output signal at a differential multiplexer is maximized by presenting, in response to a differential selection signal, a high impedance to each output port of each differential transistor of a non-selected differential transistor pair. A differential input signal is received at each differential transistor pair. Each transistor of each differential transistor pair is connected to a current source through an independent selection transistor. In response to the differential selection signal, each of the selection transistors is placed in an off state resulting in a high impedance between the output ports of the transistors of the non-selected differential transistor pair.

14 Claims, 5 Drawing Sheets

US 6,720,818 B1

METHOD AND APPARATUS FOR MAXIMIZING AN AMPLITUDE OF AN OUTPUT SIGNAL OF A DIFFERENTIAL MULTIPLEXER

BACKGROUND OF THE INVENTION

The invention relates in general to electronic circuits and more specifically to differential multiplexers.

Multiplexers allow selection of a signal from a number of signals. In response to a control signal, a multiplexer input receiving the selected signal is connected to the output of the multiplexer. Multiplexers are used in a variety of circuits and environments and are often used in differential signal circuits such as Current Mode Logic (CML) circuits. In a two input multiplexer for example, a differential signal pair is received at a first differential input and another differential signal pair is received at a second differential input. In response to a select signal and its compliment, the signal received at one of the differential signal inputs is directed to a differential output of the multiplexer. Due to their architecture, however, conventional differential multiplexers are limited in that the amplitude or "output swing" of the output signal is often less than a maximum value. Conventional techniques used to increase the amplitude of the output signals result in an increased current draw and power consumption. Therefore, there is a need for a differential multiplexer that efficiently provides an output signal with a maximum amplitude.

SUMMARY OF THE INVENTION

In an exemplary embodiment of the invention, the amplitude of a differential output signal at a differential multiplexer is efficiently maximized by presenting, in response to a differential selection signal, a high impedance to each output port of each differential transistor of a non-selected differential transistor pair. The exemplary differential multiplexer includes a selection transistor connected to the output port of each transistor of a differential transistor pair that receives a differential input signal. In response to the differential selection signal, each of the selection transistors connected to the non-selected differential transistor pair is placed in an off state resulting in a high impedance between the output ports of the transistors of the non-selected differential transistor pair.

DETAILED DESCRIPTION OF THE PREFERRED EMBODIMENTS

Figure 1:
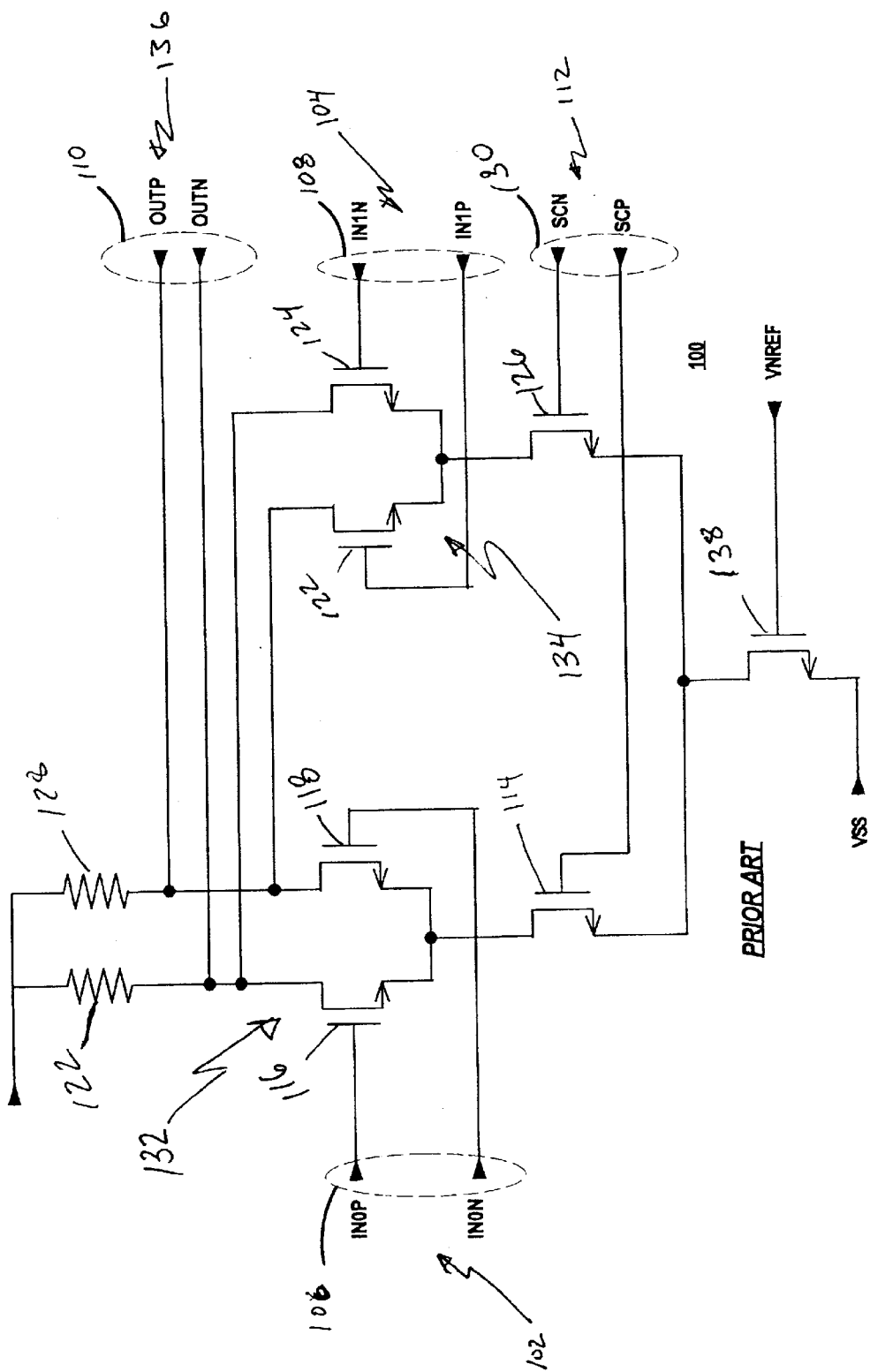
FIG. 1 is block diagram of conventional multiplexer having an output signal with a reduced amplitude.

In the interest of brevity, the following discussion is focused on multiplexers for multiplexing two differential signals. Those skilled in the art will readily apply the teachings herein to multiplexers (MUXs) having any number of inputs and outputs. As explained above, conventional multiplexers are limited in that the amplitude of the output signal is less than optimum due to the architecture of the multiplexer. FIG. 1 is a schematic diagram of a conventional multiplexer 100 having two differential inputs 106, 108, one differential output 110 and a differential selection port 130. The transistors in the conventional multiplexer 100 are field effect transistors (FETs). For each differential input 106, 108, conventional multiplexers typically include a pair of FETs 132, 134 having gates that form the differential input 106, 108. The sources of the FETs of each pair of FETs 132, 134 are connected to a single switching transistor 114, 126 responsive to a select signal received through the differential selection port 130. A current source 138 such as a FET is connected between the sources of the switching transistors 114, 126 and ground. The conventional multiplexer 100 shown in FIG. 1 includes two FET pairs 130, 134 to accommodate two differential inputs 106, 108. The gates of one FET pair 130 form the first differential input 106 and the gates of the second FET pair 134 form the other differential input 108. The differential selection port 130 is formed across the gates of the switching FETs 114, 126. The differential selection signal 112, therefore, is received across the gates of the switching transistors 114, 126.

During operation of the conventional multiplexer 100, one of the differential input signals (102, 104) received at one of the differential inputs (106, 108) is directed to the differential output 110 in accordance with the differential selection signal 112. If, for example, the SCP select signal is logic level "high", the SCN signal is logic level "low" and the first differential input signal (IN0P, IN0N) is directed to the differential output 110. Since the SCP signal is high, the switching FET 114 is turned "on" and current flows through the FET 114 and through the FET (116, 118) receiving the logic high component of the first differential input signal 102. If, for example, the IN0P signal is logic high and its complementary IN0N signal is logic low, current flows through the FET 116 causing a voltage drop across the connected load resistor 112 from the supply voltage, VDD. The OUTN signal is, therefore, logic low since there is a voltage drop across the load resistor 122. Meanwhile, the OUTP signal is high since no current flows through the other FET 118. Ideally, the other, non-selected, FET pair 134 should not interfere with the voltage levels at the differential output 110 since the SCN signal is low and the switching FET 126 is off. In conventional multiplexers, however, some current flows through the non-selected FET pair 134 connected to the switching FET 126 that is receiving the low select signal (SCN signal in the example) of the differential selection signal 112. The resulting current flow reduces the amplitude of the differential output signal 136. Continuing with the example, if both IN1P and IN1N signals are pulled to VDD due to the power down of the drive circuit to this input pair, FET 122 and FET 124 are both turned to "on" states and form a relative low impedance path between the output nodes OUTP and OUTN. Therefore, current is allowed to flow from the drain of the FET 118 through the FET pair 134 to the drain of the FET 116 resulting in a voltage drop across the load resistor 128 connected to the output signal (OUTP) that is high. Depending on the amount of current that flows through the load resistor 128, the OUTP signal may be reduced by an amount that is not insignificant and may limit performance in many applications.

Figure 2:
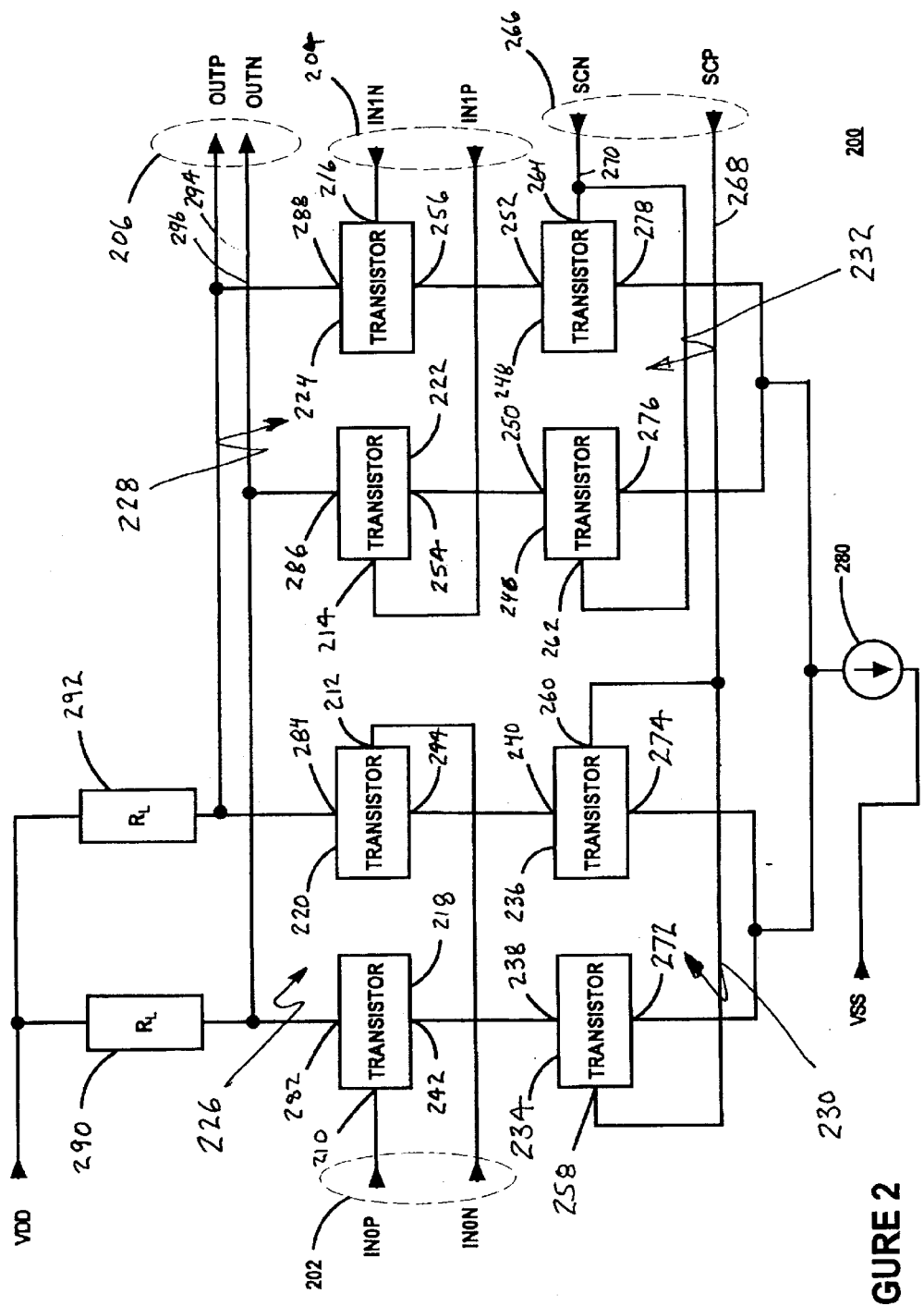
FIG. 2 is a block diagram of a differential multiplexer in accordance with the exemplary embodiment of the invention.

FIG. 2 is a block diagram of a differential multiplexer 200 in accordance with exemplary embodiment of the invention.

The differential multiplexer 200 may be implemented using discrete components, in an integrated circuit (IC) or in any combination of integrated circuits and discrete components formed in accordance with any single manufacturing technique or combination of techniques. In the exemplary embodiment, the differential multiplexer 200 is implemented with field effect transistors (FETs) within an integrated circuit in accordance with the teachings herein and known techniques. The differential multiplexer 200 can be used for a variety of circuits. An example of a suitable use for the differential multiplexer 200 includes implementing the differential multiplexer 200 in accordance with NMOS techniques to form a Current Mode Logic (CML) multiplexer.

In the exemplary embodiment, the differential multiplexer 200 is a two-to-one multiplexer that directs two differential input signals received at differential inputs 202, 204 to a differential output 206 in accordance with a selection signal received at a selection port 208. The teachings herein can be applied in accordance with known techniques to form differential multiplexers (200) having any number of inputs and outputs. Each differential input port 202, 204 is formed across the control ports 210, 212, 214, 216 of the transistors 218, 220, 222, 224 of a differential transistor pair 226, 228 in the exemplary embodiment. The differential input port 202 receiving the IN0P and IN0N signals is connected across the control ports 210, 212 of the transistors 218, 220 of a differential transistor pair 226. The differential input port 204 receiving the IN1P and IN1N signals is connected across the control ports 214, 216 of the transistors 222, 224 of another differential transistor pair 228.

A selection transistor pair 230, 232 is connected to each differential transistor pair 226, 228. Each transistor 234, 236 (246, 248) has an input port 238, 240 (250, 252) connected to an output port 242, 244 (254, 256) of the corresponding transistor 218, 220 (222, 224) of the differential transistor pair 226 (228) connected to the selection transistor pair 230 (232). The control ports 258, 260 (262, 264) of each transistor 234, 236 (246, 248) of a selection transistor pair 230 (232) are connected to each other and form a portion 268 (270) of the selection port 266 for receiving the selection signal (SCP, SCN). In the exemplary embodiment, each selection transistor pair 230 (232) receives a select signal (SCN, SCP) of a differential selection signal where each select signal SCP is the complement to the other select signal (SCN). For example, select signal SCP is a complementary signal to select signal SCN where the differential selection signal includes the SCP and SCN select signals. Each transistor 234, 236, 246, 248 of the selection transistor pairs 230, 232 includes an output port 272, 274, 276, 278 connected to a current source 280.

The input ports 282, 284, 286, 288 of each of the differential transistors 218, 220, 222, 224 are connected to a voltage supply such as a positive voltage (VDD) through a load resistor 290, 292. Each portion 294 (296) of the differential output port 206 is connected to an input port 284, 288 (282, 286) of one 220, 224 (218, 222) of the differential transistors of each differential transistor pairs 226, 228. Although in the exemplary embodiment the transistors are Negative-Channel Metal-Oxide Semiconductor (NMOS) field effect transistors (FETs), the invention is not limited to any particular type of transistor or semiconductor technology. For example, Positive-Channel Metal-Oxide Semiconductor (PMOS) as well as Complementary Metal Oxide Semiconductor (CMOS) techniques can be used in accordance with the teachings herein to from the differential multiplexer 200. The input ports (238, 240, 250, 252, 282–288), control ports (210–216, 258, 260, 262, 264) and the output ports (242, 244, 254, 256, 272–278) respectively correspond to the drain, gate and source of a field effect transistor (FET) and to the collector, base and emitter of a bipolar junction transistor (BJT).

During operation of the differential multiplexer 200, a differential output signal (OUTP, OUTN) is produced at the differential output port 206 of the multiplexer 200 in accordance with the differential selection signal (SCP, SCN). The differential input signals received at the differential input ports 202, 204 are directed to the differential output port 206 in accordance with the differential selection signal received at the differential selection port 266. The following example illustrates operation of the differential multiplexer 200 where the conventional positive logic signals are processed in a differential multiplexer 200. For the following example, VDD is a positive supply voltage, VSS is ground, and the transistors are placed in an active region when a sufficient positive voltage is applied to the control ports. The differential input signals and the sections signals may have several values. For purposes of discussion, the following signal values are assumed for the example. The select signal SCP, the input signal IN0P and the input signal IN1P are logic level high and, therefore, the select signal SCN, the input signal IN0N, and the input signal IN1N are logic level low. Those skilled in the art will readily apply the teachings herein in accordance with known techniques to understand the operation of the differential multiplexer 200 where the signals have other values.

For the example, SCP is logic high, SCN is logic low and the differential input signal (IN0P, IN0N) received at the differential input port 202 is directed to the differential output port 206. Since SCP is high, both transistors 234, 236 of the selection transistor pair 230 allow current to flow from the output ports 242, 244 of the differential transistors 218, 220 in accordance with the differential input signal received at the differential input port 202. Since IN0P is high, current flows through the load resistor 290 resulting in a voltage drop across the load resistor 290 to form an OUTN signal that is logic low. Since IN0N is low, no current flows through the other load resistor 292, resulting in an OUTP signal that is high.

One advantage of the differential multiplexer 200 over conventional multiplexers is that no current flows through the other, non-selected differential transistor pair (transistor pair 228 in the example). Since SCN is low, both of the transistors 246, 248 in the non-selected transistor selection pair 232 are "off" and do not allow current to flow from the output ports 254, 256 of the non-selected differential transistor pair 228. The output ports 254, 256 are not connected to each other and the impedance between the two output ports 254, 256 is much higher than in conventional multiplexers. The high impedance significantly reduces the amount of current that flows through the load resistor 292 due to the non-ideal operation of the non-selected transistor pair 232. Accordingly, the non-selected transistor pair 232 does not reduce the amplitude of the output signal and the dynamic range or "output swing" of the differential output signal is maximized.

Figure 3:
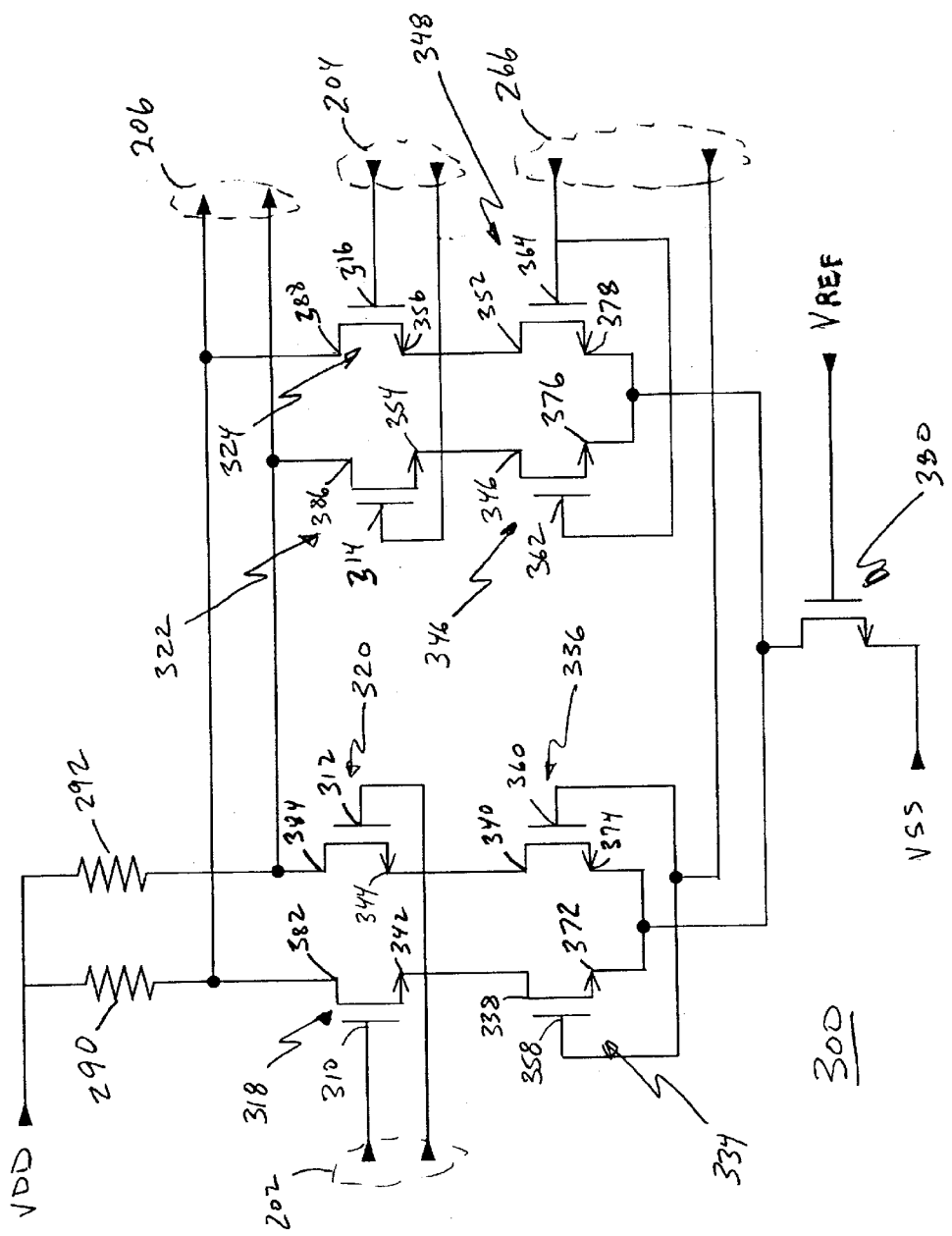
FIG. 3 is a schematic diagram of the differential multiplexer where the transistors are negative-channel metal oxide semiconductor (NMOS) field effect transistors (FETs) in accordance with the exemplary embodiment of the invention.

FIG. 3 is a schematic diagram of the differential multiplexer 200 in accordance with the exemplary embodiment where the transistors 218, 220, 222, 224, 234, 236, 246, 248 are Negative-Channel Metal Oxide Semiconductor (NMOS) field effect transistors (FETs). The current source 280 is a NMOS transistor that is biased at a bias voltage (Vbias). As explained above, the differential multiplexer 200 can be implemented using a variety of techniques and manufacturing processes. The transistors 218, 220, 222, 224, 234, 236, 246, 248 may be any type of transistors such bipolar junction transistors (BJTs) including npn and pnp types, or (FETs) such as MOSFETS or JFETS including n-channel and p-channel or combinations of different types of transistors. Those skilled in the art will readily apply the teachings herein to differential multiplexers 200 with other types of transistors and power supply relationships. A suitable implementation of the NMOS transistors 318, 320, 322, 324, 334, 336, 346, 348 is a NMOS triple-well n-channel construction. The control ports 210–216, 258, 260, 262, 264 discussed in FIG. 2 correspond to transistor gates 310–316, 358, 360, 362, 364 of the NMOSFETS illustrated in FIG. 3. The input ports 238, 240, 250, 252, 282–288 correspond to the transistor drains 338, 340, 350, 352, 382–388 and the output ports the output ports 242, 244, 254, 256, 272–278 correspond to the transistor sources 342, 344, 354, 356, 372–378. The values of the resistors 290, 292 are selected in accordance with the desired output impedance of the differential output 144 of the differential multiplexer 200. A suitable value for the resistors 290, 292 is 50 ohms. The current source 280 may be implemented using an NMOS transistor 380. A reference voltage to the gate of the transistor 380 is denoted by VREF in FIG. 3.

Figure 4:
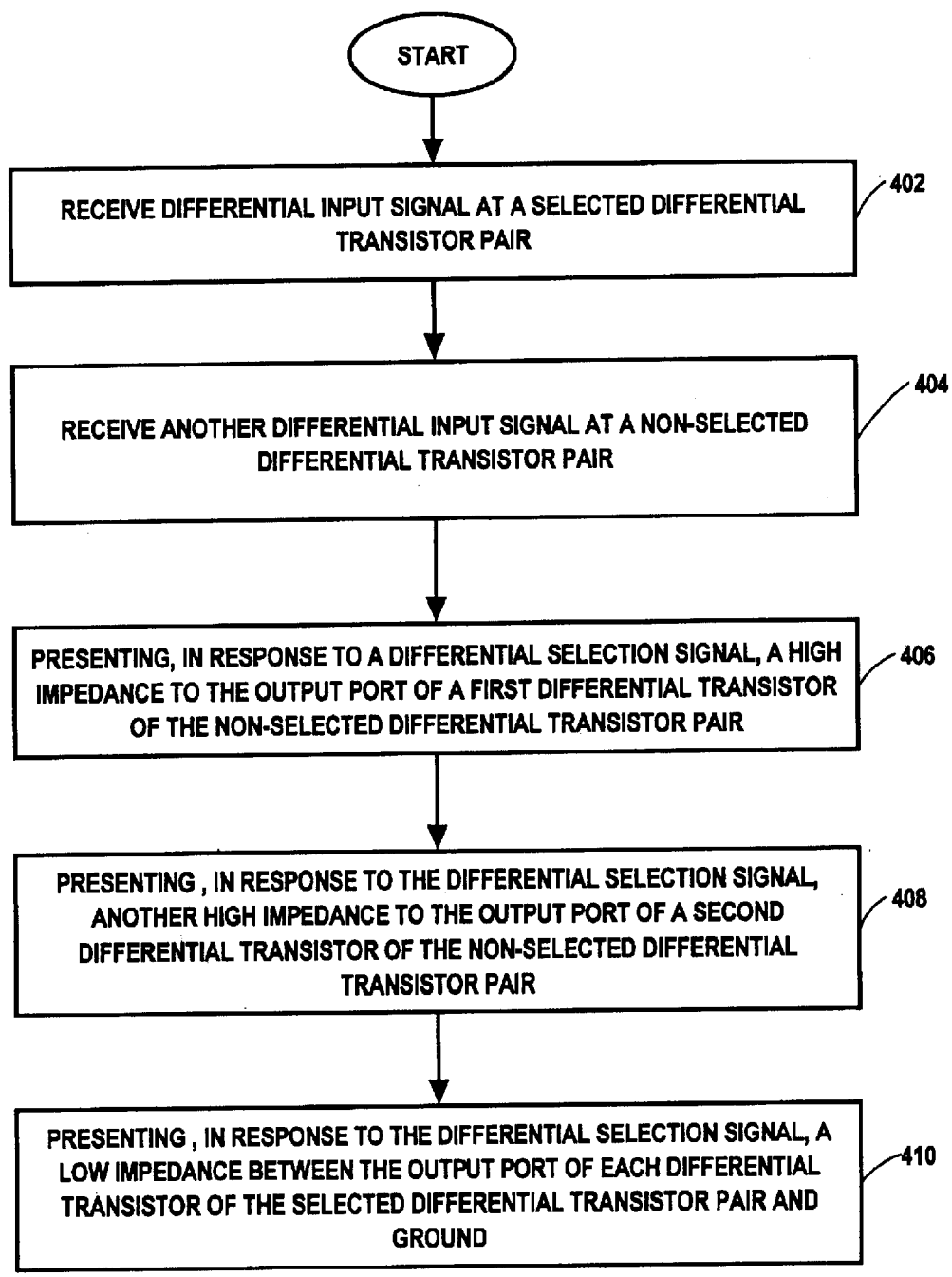
FIG. 4 is a flow chart of method of maximizing the amplitude of a differential output signal at an output of a differential multiplexer in accordance with the exemplary embodiment of the invention.

FIG. 4 is a flow chart of method of maximizing an amplitude of a differential output signal at a differential output of a differential multiplexer 200 in accordance with the exemplary embodiment of the invention. The method is performed within the differential multiplexer 200 described in reference to FIG. 2 in the exemplary embodiment. The method, however, can be performed using any combination of hardware, software and firmware based on the teachings and method is not intended to be limited to performance within the differential multiplexer 200.

At step 402, a differential input signal is received at a selected differential transistor pair 226. Each of the transistors 218, 220, 222, 224 of the differential transistor pairs 226, 228 having input ports 282, 284, 286, 288 connected to a voltage supply through one of two load resistors 290, 292. The differential output port 206 is formed across each set of input ports 282, 284, (286, 288). The control ports 210, 212 (214, 216) of each differential transistor pair 226 (228) form a differential input port 202 (204). The differential input signal is received at across the control ports 210, 212 of the selected differential transistor pair 226.

At step 404, another differential input signal is received at the non-selected differential transistor pair 228.

At step 406, in response to the differential selection signal, a high impedance is presented to the output port 254 of a first differential transistor 222 of the non-selected differential transistor pair 228. In the exemplary embodiment, the high impedance is presented by placing the transistor 246 in an off state where the transistor 246 is connected between the output port 254 of the first input differential transistor 222 and ground.

At step 408, in response to the differential selection signal, another high impedance is presented to the output port 256 of a second differential transistor 224 of the non-selected differential transistor pair 228. In the exemplary embodiment, the high impedance is presented by placing the transistor 248 in an off state where the transistor 248 is connected between the output port 256 of the second input differential transistor 224 and ground. The selection transistors 246, 248 have input ports connected 250, 252 to the output ports 254, 256 of the differential transistors 222, 224. The control ports 262, 264 of the selection transistors 246, 248 receive the low signal of the selection signal. As discussed above, suitable transistors 246, 248 include triple well N-channel NMOS FETS 346, 348. Since each differential transistor 222, 224 of the non-selected differential transistor pair 228 is connected to ground through a separate high impedance, the current flow due to the non-selected differential transistor pair 228 is reduced as compared to conventional multiplexers.

At step 410, in response to the differential selection signal, a low impedance is presented between each output port 242, 244 of the differential transistors 218, 220 of the selected differential transistor pair 226 and ground. In the exemplary embodiment, the low impedance is presented by placing each the transistors connected to the output ports 242, 244 of the differential transistors 218, 220 into an active or "on" state. The logic high signal of the differential selection signal turns the transistors on an allows current to flow in accordance based on the differential input signal. As discussed above, suitable transistors 234, 236 include triple well N-channel NMOS FETS 334, 336.

Figure 5:
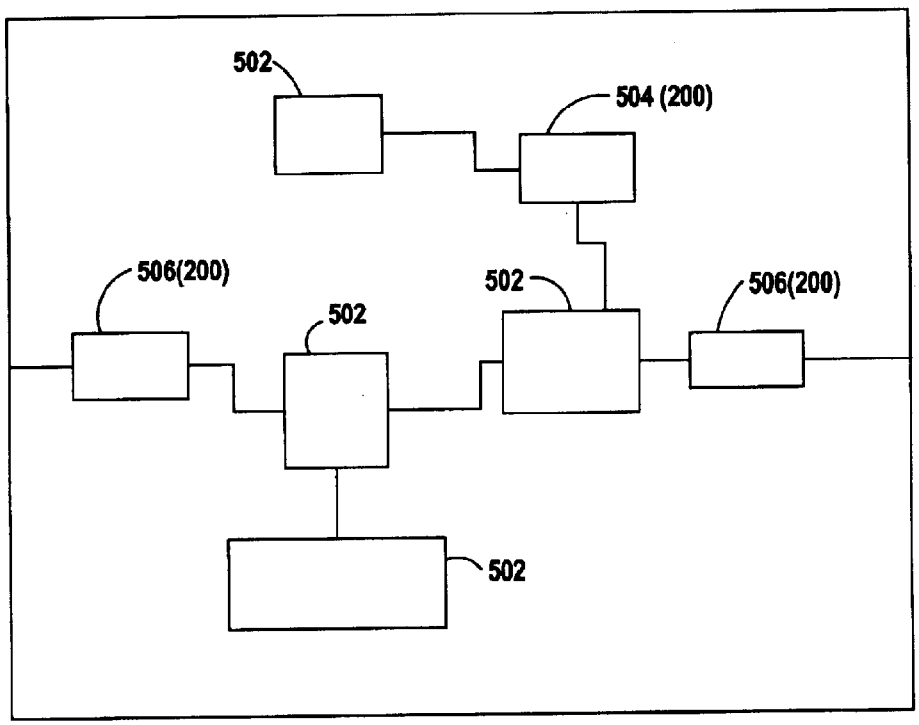
FIG. 5 is a block diagram of a top view representation of an Integrated Circuit (IC) in accordance with the exemplary embodiment of the invention.

FIG. 5 is block diagram of a top view representation of an integrated circuit (IC) 500 including at least one differential multiplexer 200 implemented as an IC differential multiplexer 504, 506 in accordance with the exemplary embodiment of the invention. The exemplary IC 500 includes several circuits 502 and IC differential multiplexers 504, 506 formed with transistors, resistors, capacitors and other components using appropriate etching and imprinting techniques on a semiconductor material such a silicon, germanium, or Gallium Arsenide (GaAs). The IC differential multiplexor 504 may be connected between other circuits 502 on the IC 500 to multiplex signals between the circuits 502 on the IC 500. The IC differential multiplexer 506 may provide an interface to external circuits not on the IC 500. Further, the IC 500 can be manufactured to include only an IC differential multiplexer 504 or an array of differential multiplexers 504, 506.

Clearly, other embodiments and modifications of this invention will occur readily to those of ordinary skill in the art in view of these teachings. Therefore, this invention is to be limited only by following claims, which include all such embodiments and modifications when viewed in conjunction with the above specification and accompanying drawings.

We claim:

1. A multiplexer for providing, at a differential output, a signal received at a selected differential input of a plurality of differential inputs, the multiplexer comprising:

a first differential transistor pair, each transistor of the first differential transistor pair having a control port, an input port and an output port, the control ports forming one of the plurality of differential inputs and the input ports connected to a first voltage potential and forming the differential output;

a first selection transistor pair, each transistor of the first selection transistor pair having a control port, an input port and an output port, each of the input ports connected to one of the output ports of the transistors of the first differential transistor pair, the output ports of the first selection transistor pair connected to a second voltage potential, the control ports of the first selection transistor pair connected to each other and forming at least a first portion of a select port of the multiplexer;

a second differential transistor pair, each transistor of the second differential transistor pair having a control port, an input port and an output port, the control ports forming another of the plurality of differential inputs and the input ports connected to the first voltage potential; and, a second selection transistor pair, each transistor of the second selection transistor pair having a control port, an input port and an output port, each of the input ports connected to one of the output ports of the transistors of the second differential transistor pair, the output ports of the second selection transistor pair connected to a second voltage potential, the control ports of the second selection transistor pair connected to each other and forming at least a second portion of the select port of the multiplexer;

wherein the select port is a differential select port, the first portion of the select port and the second portion of the select port for receiving a differential select signal having a select signal and a complementary select signal; and, wherein the output ports are connected to the second voltage source through a current source.

2. A multiplexer in accordance with claim 1, wherein each of the input ports of the first differential transistor pair are connected to the first voltage potential through a resistor.

3. A multiplexer in accordance with claim 1, wherein the current source is a field effect transistor (FET).

4. A multiplexer in accordance with claim 3, wherein each of the transistors is a Negative-Channel Metal Oxide semiconductor field effect transistor (NMOS FET).

5. A multiplexer for providing, at a differential output, a signal received at a selected differential input of a plurality of differential inputs, the multiplexer comprising:

a plurality of differential transistor pairs, each transistor of each of the differential transistor pairs having a control port, an input port and an output port, the control ports of each differential pair forming one of the plurality of differential inputs and the input ports connected to a first voltage potential and forming the differential output; and a plurality of selection transistor pairs, each selection transistor pair connected to an associated differential transistor pair of the differential transistor pairs, each transistor of each of the selection transistor pairs having a control port, an input port and an output port, each of the input ports of each selection transistor pair connected to one of the output ports of the transistor of the associated differential transistor pair, the output ports of each selection transistor pair connected to a second voltage potential, the control ports of each selection transistor pair connected to the control port of each other selection transistor pair and forming a select port of the multiplexer;

wherein the input ports of the differential transistor pairs are connected to the first voltage potential through resistors; and, wherein the output ports of the selection transistor pairs are connected to the second voltage potential through a current source.

6. An integrated circuit comprising:

a multiplexer for providing, at a differential output, a signal received at a selected differential input of a plurality of differential inputs, the multiplexer comprising:

a first differential transistor pair, each transistor of the first differential transistor pair having a control port, an input port and an output port, the control ports forming one of the plurality of differential inputs and the input ports connected to a first voltage potential and forming the differential output;

a first selection transistor pair, each transistor of the first selection transistor pair having a control port, an input port and an output port, each of the input ports connected to one of the output ports of the transistors of the first differential transistor pair, the output ports of the first selection transistor pair connected to a second voltage potential, the control ports of the first selection transistor pair connected to each other and forming at least a first portion of a select port of the multiplexer;

a second differential transistor pair, each transistor of the second differential transistor pair having a control port, an input port and an output port, the control ports forming another of the plurality of differential inputs and the input ports connected to the first voltage potential; and, a second selection transistor pair, each transistor of the second selection transistor pair having a control port, an input port and an output port, each of the input ports connected to one of the output ports of the transistors of the second differential transistor pair, the output ports of the second selection transistor pair connected to a second voltage potential, the control ports of the second selection transistor pair connected to each other and forming at least second portion of the select port of the multiplexer;

wherein the select port is a differential select port, the first portion of the select port and the second portion of the select port for receiving a differential select signal having a select signal and a complementary select signal; and, wherein the output ports are connected to the second voltage source through a current source.

7. An integrated circuit in accordance with claim 6, wherein each of the input ports of the first differential transistor pair are connected to the first voltage potential through a resistor.

8. An integrated circuit in accordance with claim 6, wherein the current source is a field effect transistor (FET).

9. An integrated circuit in accordance with claim 8, wherein each of the transistors is a Negative-Channel Metal Oxide semiconductor field effect transistor (NMOS FET).

10. An integrated circuit comprising a differential multiplexer for providing, at a differential output, a signal received at a selected differential input of a plurality of differential inputs, the multiplexer comprising:

a plurality of differential transistor pairs, each transistor of each of the differential transistor pairs having a control port, an input port and an output port, the control ports of each differential pair forming one of the plurality of differential inputs and the input ports connected to a first voltage potential and forming the differential output; and a plurality of selection transistor pairs, each selection transistor pair connected to an associated differential transistor pair of the differential transistor pairs, each transistor of each of the selection transistor pairs having a control port, an input port and an output port, each of the input ports of each selection transistor pair connected to one of the output ports of the transistor of the associated differential transistor pair, the output ports of each selection transistor pair connected to a second voltage potential, the control ports of each selection transistor pair connected to the control port of each other selection transistor pair and forming a select port of the multiplexer;

wherein the input ports of the differential transistor pairs are connected to the first voltage potential through resistors; and wherein the output ports of the selection transistor pairs are connected to the second voltage potential through a current source.

11. A method of maximizing an amplitude of a differential output signal at a differential output of a differential multiplexer, the method comprising:

receiving a first differential input signal at a selected differential transistor pair having input ports connected to a voltage supply through a pair of load resistors and forming the differential output at the input ports;

receiving a second differential input signal at a non-selected differential transistor pair having input ports connected to the voltage supply through the pair of load resistors;

presenting, in response to a differential selection signal, a first high impedance to the output port of a first differential transistor of the non-selected differential transistor pair;

wherein the presenting the first impedance comprises placing a first selection transistor in an off state, the first selection transistor having an input port connected to the output Port of the first differential transistor; and presenting, in response to the differential selection signal, a second high impedance to the output port of a second differential transistor of the non-selected differential transistor pair;

wherein the presenting the second high impedance comprises placing a second selection transistor in an off state, the second selection transistor having an input port connected to the output port of the second differential transistor;

wherein the first selection transistor and the second selection transistor each have an output port connected to ground; and wherein the first selection transistor and the second selection transistor output ports are connected to ground through a current source.

12. A method in accordance with claim 11 wherein each of the differential transistor pairs comprises a first differential field effect transistor (first FET) and a second differential field effect transistor (second FET), the first differential FET having a drain connected to a first load resistor of the load resistor pair and having a source connected to the selection transistor, the second FET having a drain connected to a second load resistor of the load resistor pair and having a source connected to the another selection transistor.

13. A method in accordance with claim 11, further comprising:

presenting, in response to the differential selection signal, a low impedance between an output port of each differential transistor of the selected transistor pair and a current source.

14. A method in accordance with claim 13, wherein the presenting the low impedance comprises:

placing a selected selection transistor in an on state, the selected selection transistor having an input port connected to the output port of a first selected differential transistor; and placing a another selected selection transistor in an on state, the another selected selection transistor having an input port connected to the output port of a second selected differential transistor.

* * * * *